(12) United States Patent
Palusa

(10) Patent No.: US 6,359,470 B1
(45) Date of Patent: Mar. 19, 2002

(54) ULTRA LOW POWER VOLTAGE TRANSLATION CIRCUITRY AND ITS APPLICATION IN A TTL-TO-CMOS BUFFER

(75) Inventor: Chaitanya Palusa, Santa Clara, CA (US)

(73) Assignee: Alliance Semiconductor, Santa Clara, CA (US)

( * ) Notice: Subject to any disclaimer, the term of this patent is extended or adjusted under 35 U.S.C. 154(b) by 0 days.

(21) Appl. No.: 09/735,877

(22) Filed: Dec. 13, 2000

(51) Int. Cl.[7] .............................................. H03K 17/018
(52) U.S. Cl. .............................. 326/70; 326/68; 326/81; 326/83
(58) Field of Search .............................. 326/63, 68, 70, 326/71, 73–78, 80, 81, 83, 86

(56) References Cited

U.S. PATENT DOCUMENTS 5,408,147 A * 4/1995 Yarbrough et al. ........... 326/68
5,420,527 A * 5/1995 Naber .......................... 326/68
5,754,059 A * 5/1998 Tanghe et al. ................ 326/77

* cited by examiner

Primary Examiner—Michael Tokar
Assistant Examiner—Don Phu Le
(74) Attorney, Agent, or Firm—Stallman & Pollock LLP

(57) ABSTRACT

The power consumed by a voltage translator circuit, such as a TTL-to-CMOS buffer, is substantially reduced by changing the supply voltages provided to the input inverter. By reducing the supply voltage provided to the source of the p-channel transistor of the input inverter, the lowest logic-high TTL voltage applied to the gate turns off the p-channel transistor and turns on the n-channel transistor of the input inverter. By increasing the supply voltage provided to the source of the n-channel transistor of the input inverter, the highest logic-low TTL voltage applied to the gate turns off the n-channel transistor and turns on the p-channel transistor.

17 Claims, 1 Drawing Sheet

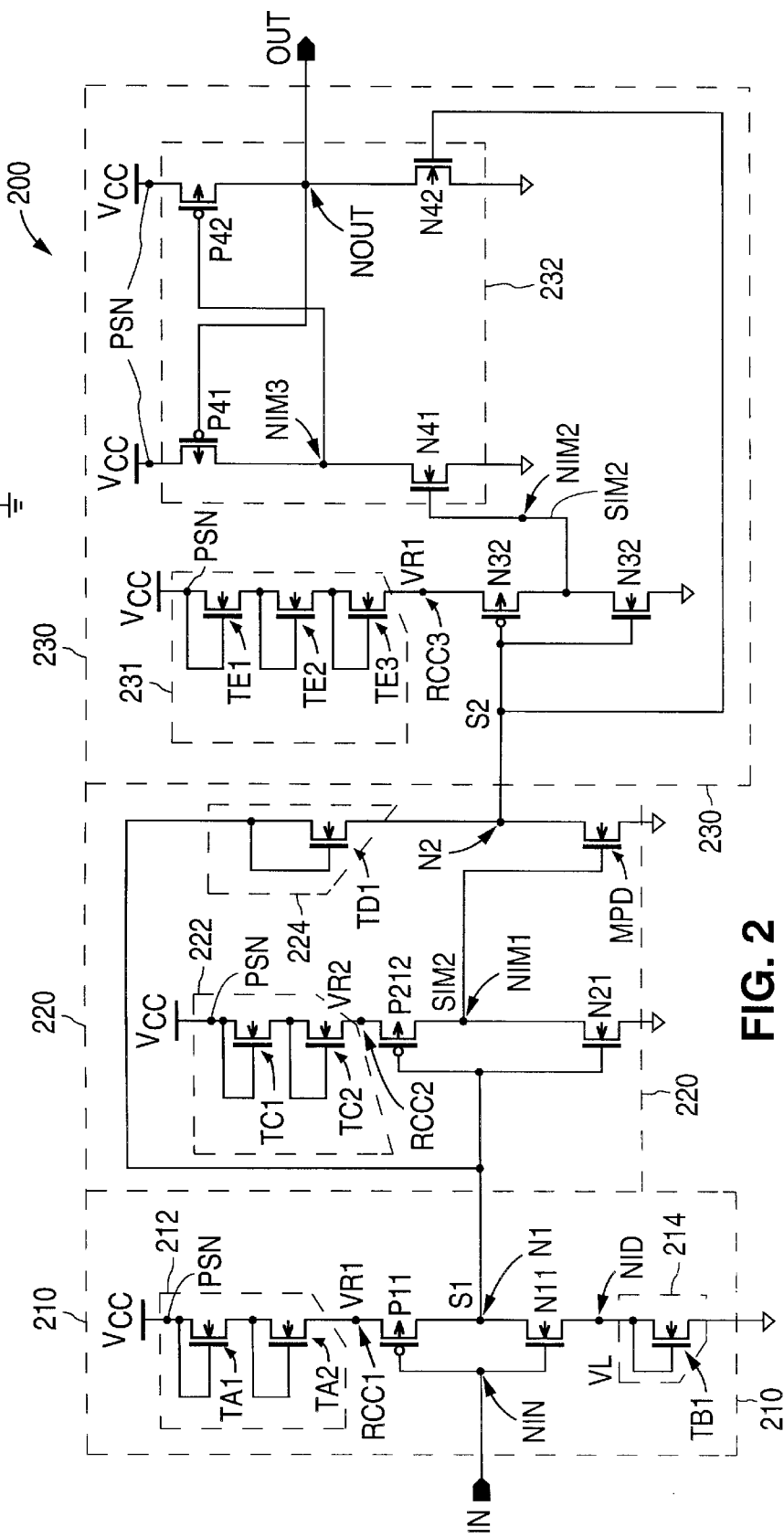
FIG. 1A (PRIOR ART)
FIG. 1B (PRIOR ART)
FIG. 2

ULTRA LOW POWER VOLTAGE TRANSLATION CIRCUITRY AND ITS APPLICATION IN A TTL-TO-CMOS BUFFER

BACKGROUND OF THE INVENTION

1. Field of the Invention

The present invention relates to extremely low power voltage translator circuitry and, more particularly, to an ultra low power TTL-to-CMOS buffer.

2. Description of the Related Art

A voltage translator circuit is a level shifter that shifts voltages from one logic level to another logic level. A TTL-to-CMOS buffer, in particular, is a device that converts TTL logic levels into CMOS logic levels. With TTL logic levels, a logic high is represented by voltages that fall within a range from VIH (MIN) to VIH (MAX), such as +2.0V to VCC (e.g., +5.0V). In addition, a logic low is represented by voltages that fall within a range from VIL (MIN) to VIL (MAX), such as ground to +0.8V. On the other hand, with CMOS logic levels, a logic high is represented by VCC, and a logic low is represented by ground.

FIG. 1A shows a schematic diagram that illustrates a conventional TTL-to-CMOS buffer 100. As shown in FIG. 1A, TTL-to-CMOS buffer 100 includes a first inverter 110 and a second inverter 112 that is connected in series with first inverter 110. Inverter 110 is typically implemented as a standard inverter, while inverter 112 is typically implemented with a Schmitt trigger type of arrangement for good hysteresis characteristics.

FIG. 1B shows a schematic diagram that illustrates first inverter 110. As shown in FIG. 1B, inverter 110 includes a p-channel transistor P1 and an n-channel transistor N1. P-channel transistor P1 has a source connected to a power supply node PSN to receive a power supply voltage VCC, a drain connected to an output node NOUT, and a gate connected to an input node NIN. N-channel transistor N1 has a source connected to ground, a drain connected to the output node NOUT, and a gate connected to the input node NIN.

In operation, p-channel transistor P1 turns on and conducts when the source-to-drain voltage VSD is greater than zero (e.g., VSD>0), and the gate-to-source voltage VGS is less than the threshold voltage VTP of the transistor (e.g., VGS<VTP). N-channel transistor N1 turns on and conducts when the drain-to-source voltage VDS is greater than zero (e.g., VDS<0), and the gate-to-source voltage VGS is greater than the threshold voltage VTN of the transistor (e.g., VGS>VTN).

One of the advantages of inverter 110 is that when an input voltage VIN on the input node NIN is at CMOS levels, no current is dissipated. For example, when the input voltage VIN is at ground, p-channel transistor P1 is turned on and n-channel transistor N1 is turned off. Similarly, when the input voltage VIN is at VCC, p-channel transistor P1 is turned off and n-channel transistor N1 is turned on.

One of the disadvantages of inverter 110, however, is that when the input voltage VIN is at TTL levels, a substantial amount of current can be dissipated as transistors P1 and N1 are often both turned on. For example, when a logic high is represented by an input voltage VIN of +2.0V, the threshold voltage VTP is −1.0V, the threshold voltage VTN is +0.7V, and VCC is +5.0V, both transistors P1 and N1 are turned on. (For transistor P1, VGS=2.0−5=−3.0. Since −3.0V is less than the threshold voltage VTP of −1.0V, transistor P1 is turned on. For transistor N1, VGS=2.0−0=2.0. Since 2.0V is greater than the threshold voltage VTN of 0.7V, transistor N1 is turned on.)

Similarly, when a logic low is represented by an input voltage VIN of +0.8V, both transistors P1 and N1 are again turned on. (For transistor P1, VGS=0.8−5=−4.2. Since −4.2V is less than the threshold voltage VTP of −1.0V, transistor P1 is turned on. For transistor N1, VGS=0.8−0= 0.8. Since 0.8V is greater than the threshold voltage VTN of 0.7V, transistor N1 is turned on.)

Since transistors P1 and N1 can both be turned on at the same time, the strength of n-channel transistor N1 is typically set to insure that when the input voltage VIN is greater than VIH (MIN), n-channel transistor N1 overpowers p-channel transistor P1 so that the voltage on the output node NOUT is pulled down to ground. In addition, the strength of n-channel transistor N1 is also set to insure that when the input voltage VIN is less than VIL (MAX), p-channel transistor P1 overpowers n-channel transistor N1 and the voltage on the output node NOUT is pulled up to VCC.

In almost every conventional TTL-to-CMOS buffer or a level shifter, an inverter, with its input at one logic level, and its power supplies at another logic level, is present. In a TTL-to-CMOS buffer, since a substantial amount of current is dissipated when the input voltage VIN is at TTL levels and transistors P1 and N1 are both turned on, there is a need for an inverter that operates on TTL levels, and dissipates little or no current throughout the range of operation. This is also applicable for a generalized level shifter.

SUMMARY OF THE INVENTION

Conventionally, a substantial amount of current is dissipated when the voltage input to a TTL-to-CMOS buffer via an input inverter is at TTL levels. This is because the TTL levels turn on both the p-channel and n-channel transistors of the input inverter. The present invention reduces the amount of current dissipated at TTL levels by insuring that only one of the two transistors is on when the input voltage is at a TTL level. The present invention is also applicable in the case of other low power level shifter circuits.

A translator circuit in accordance with the present invention includes an inversion stage that outputs an inversion signal in response to an input signal. The inversion signal has a logic high equal to a first voltage which is less than an upper supply voltage, and a logic low equal to a second voltage which is greater than a lower supply voltage.

The circuit also includes a logic-low translation stage that outputs a translation signal in response to the inversion signal. The translation signal has a logic high equal to a second voltage which is less than the first voltage, and a logic low equal to the lower supply voltage. The circuit of the present invention further includes a logic-high translation stage that outputs an output signal in response to the translation signal. The output signal has a logic high equal to the upper supply voltage, and a logic low equal to the lower supply voltage.

The present invention also includes a method for operating a translator circuit. The method includes the step of outputting an inversion signal from an inversion stage in response to an input signal. The inversion signal has a logic high equal to a first voltage which is less than an upper supply voltage, and a logic low equal to a second voltage which is greater than a lower supply voltage.

The method also includes the step of outputting a translation signal from a logic-low translation stage in response to the inversion signal. The translation signal has a logic high equal to a second voltage which is less than the first voltage, and a logic low equal to the lower supply voltage. The method further includes the step of outputting an output signal from a logic-high translation stage in response to the translation signal. The output signal has a logic high equal to the upper supply voltage, and a logic low equal to the lower supply voltage.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 1A is a schematic diagram illustrating a conventional TTL-to-CMOS buffer 100.

FIG. 1B is a schematic diagram illustrating first inverter 110.

FIG. 2 is a schematic illustrating a TTL-to-CMOS buffer 200 in accordance with the present invention.

DETAILED DESCRIPTION

FIG. 2 shows a schematic that illustrates a TTL-to-CMOS buffer 200 in accordance with the present invention. As described in greater detail below, buffer 200 dissipates substantially less current than conventional buffers throughout the range of operation by changing the supply voltages provided to the input inverter that receives the TTL logic levels.

As shown in FIG. 2, buffer 200 includes a low-power inversion stage 210 that inverts an input signal IN to output an inversion signal S1 which has a logic state opposite to that of the input signal IN. Stage 210 includes a first voltage drop circuit 212 that has a number of transistors TA which are connected between a power supply node PSN and a first reduced power supply node RCC1. Each of the transistors TA has an associated voltage drop which, in combination, define a first reduced voltage VR1 on the reduced power supply node RCC1.

For example, FIG. 2 shows two n-channel diode-connected transistors TA1 and TA2 connected between the power supply node PSN and the first reduced power supply node RCC1. Transistor TA1 has a drain and a gate connected to the power supply node PSN, a source, and a first threshold voltage drop VTH1. Transistor TA2 has a drain and a gate connected to the source of transistor TA1, a source connected to the first reduced power supply node RCC1, and a second threshold voltage drop VTH2. The combined threshold voltage drops VTH1 and VTH2 define the first reduced voltage VR1. (VCC−VTH1−VTH2=VR1.)

The value of the first reduced voltage VR1 can be changed by adding or subtracting transistors TA, or changing the voltage drops of the transistors TA. Other circuit elements that provide a voltage drop may also be used in place of, or in combination with, the diode-connected transistors TA of circuit 212.

Stage 210 also includes an inverter that is connected to receive the input signal IN, and to output the inversion signal S1. The inverter includes a p-channel transistor P11 and an n-channel transistor N11. P-channel transistor P11 has a source connected to the first reduced power supply node RCC1, and a drain connected to an inversion node N1 to output the inversion signal S1. In addition, transistor P11 also has a gate connected to an input node NIN to receive the input signal IN, and a first p-channel threshold voltage VTP1.

N-channel transistor N11 has a drain connected to the inversion node N1 to output the inversion signal S1, and a source connected to an increased ground node NID. In addition, transistor N11 has a gate connected to the input node NIN to receive the input signal IN, and a first n-channel threshold voltage VTN1.

Stage 210 further includes a voltage drop circuit 214 that has a number of transistors TB which are connected between the increased ground node NID and ground. Each of the transistors TB has an associated voltage drop which, in combination, define an increased ground voltage VL on the increased ground node NID.

For example, FIG. 2 shows one n-channel diode-connected transistor TB1 connected between the increased ground node NID and ground. Transistor TB1 has a drain and a gate connected to the source of transistor N11, a source connected to ground, and a third threshold voltage VTH3. The threshold voltage drop VTH3 defines the increased ground voltage VL. (0+VTH3=VL.)

The value of the increased ground voltage VL can be changed by adding transistors TB, or changing the voltage drop of the transistor TB. Other circuit elements that provide a voltage drop may also be used in place of, or in combination with, the diode-connected transistor TB of circuit 214.

In operation, the first reduced voltage VR1 is set such that when the voltage of the input signal IN on the input node NIN is equal to VIH (MIN), the gate-to-source voltage VGS of transistor P11 is greater than the threshold voltage VTP1. When the gate-to-source voltage VGS of transistor P11 is greater than the threshold voltage VTP1, transistor P11 is turned off.

Similarly, the increased ground voltage VL is set such that when the voltage of the input signal IN on the input node NIN is equal to VIL (MAX), the gate-to-source voltage VGS of transistor N11 is less than the threshold voltage VTN1. When the gate-to-source voltage VGS of transistor N11 is less than the threshold voltage VTN1, transistor N11 is turned off.

For example, assume that the voltage of the input signal IN and the voltage VIH (MIN) are +2.0V, the threshold voltage VTP1 is −1.0V, the threshold voltage VTN1 is +0.8V. Further assume that a power supply voltage VCC on the power supply node PSN is +5.0V, transistors TA1 and TA2 each have threshold voltage drops of 1.2V and 1.0V respectively, and transistor TB1 has a threshold voltage drop of 0.7V. (The threshold voltages of transistors TA1, TA2 and N11 are higher than that of transistor TB1 because of the body effect, and each of them shows a corresponding increase.)

In this example, transistor P1 is turned off and transistor N1 is turned on. (RCC1=5−1.2−1.0=+2.8, and VL=0+0.7=+0.7. For transistor P1, VGS=2.0−2.8=−0.8. Since −0.8V is not less than the threshold voltage VTP1 of −1.0V, transistor P11 is turned off. For transistor N11, VGS=2.0−0.7=+1.3. Since 1.3V is greater than the threshold voltage VTN1 of 0.8V, transistor N11 is turned on.)

Similarly, assume that the voltage of the input signal IN and the voltage VIL (MAX) are +0.8V. In this example, transistor P11 is turned on and transistor N11 is turned off. (For transistor P11, VGS=0.8−2.8=2.0. Since −2.0V is less than the threshold voltage VTP1 of −1.0V, transistor P11 is turned on. For transistor N11, VGS=0.8−0.7=0.1. Since 0.1V is less than the threshold voltage VTN1 of 0.8V, transistor N11 is turned off.)

Thus, the inversion signal S1 has a logic high equal to the first reduced voltage VR1 when the voltage of the input signal IN is between VIL (MAX) and ground. In addition, the inversion signal S1 has a logic low equal to the increased ground voltage VL when the voltage of the input signal IN is between VIH (MIN) and VCC.

One of the advantages of the present invention is that stage 210 significantly reduces the current dissipated from TTL signal levels since only one of the two transistors P11 and N11 are on when the input signal IN is at TTL levels. Stage 210 dissipates current in the order of nanoamperes when the input signal IN is in the TTL range of operation, ground to VIL (MAX) and VIH (MIN) to VCC. Further, stage 210 dissipates current in the order of microamperes when the input signal IN is in the narrow transition range VIL (MAX) to VIH (MIN), and dissipates no current in some parts of the transition range VIL (MAX) to VIH (MIN). This transition range, however, is not a part of the operation specifications.

As further shown in FIG. 2, buffer 200 also includes a logic-low translation stage 220 that outputs a translation signal S2 in response to the inversion signal S1. The translation signal S2 has a logic state that is the same as the logic state of the inversion signal S1. As described in greater detail below, the translation signal S2 has a logic high equal to a voltage which is less than the first reduced voltage VR1, and a logic low equal to ground. Thus, stage 220 outputs the translation signal S2 with a logic low that is equal to a CMOS logic low.

Stage 220 includes a voltage drop circuit 222 that has a number of transistors TC that are connected between the power supply node PSN and a second reduced power supply node RCC2. Each of the transistors TC has an associated voltage drop which, in combination, define a second reduced voltage VR2 on a second reduced power supply node RCC2.

For example, FIG. 2 shows two n-channel diode-connected transistors TC1 and TC2 connected between the power supply node PSN and the second reduced power supply node RCC2. Transistor TC1 has a drain and a gate connected to the power supply node PSN, a source, and a fourth threshold voltage drop VTH4. Transistor TC2 has a drain and a gate connected to the source of transistor TC1, a source connected to the second reduced power supply node RCC2, and a fifth threshold voltage drop VTH5. The combined threshold voltage drops VTH4 and VTH5 define the second reduced voltage VR2. (VCC−VTH4−TH5=VR2.)

Stage 220 also includes an inverter that is connected to receive the inversion signal S1, and to output a first intermediate signal SIM1 which has a logic state opposite to the inversion signal S1. The inverter includes a p-channel transistor P21 and an n-channel transistor N21. P-channel transistor P21 has a source connected to the second reduced power supply node RCC2, and a drain connected to a first intermediate node NIM1 to output the first intermediate signal SIM1. In addition, transistor P21 also has a gate connected to the inversion node N1 to receive the inversion signal S1, and a second p-channel threshold voltage VTP2.

N-channel transistor N21 has a drain connected to the first intermediate node NIM1 to output the first intermediate signal SIM1, and a source connected to ground. In addition, transistor N21 has a gate connected to the inversion node N1 to receive the inversion signal S1, and a second n-channel threshold voltage VTN2.

Stage 220 further includes a voltage drop 224 that has a number of transistors TD which are connected between the inversion node N1 and a translation node N2. For example, FIG. 2 shows one n-channel diode-connected transistor TD1 connected between the inversion node N1 and the translation node N2. Transistor TD1 has a drain and a gate connected to the inversion node N1. Transistor TD1 also has a source connected to the translation node N2, and a sixth threshold voltage VTH6. Other circuit elements that provide a voltage drop may alternately be used in place of, or in combination with, the diode-connected transistors of circuits 222 and 224.

Stage 220 additionally includes an n-channel control transistor MPD that has a drain connected to the translation node N2, and a source connected to ground. Transistor MPD also has a gate connected to the first intermediate node NIM1, and a seventh threshold voltage VTH7.

In operation, when the voltage of the inversion signal S1 is equal to the increased ground voltage VL (representing a logic low), transistor P21 is turned on and transistor N21 is turned off. When transistor P21 is turned on, the voltage of the first intermediate signal SIM1 is pulled high which, in turn, turns on transistor MPD. When transistor MPD is turned on, the voltage of the translation signal S2 on the translation node N2 is pulled to ground. This, in turn, turns off transistor TD1.

When the voltage of the inversion signal S1 is equal to the first reduced voltage RCC1 (representing a logic high), transistor P21 is turned off and transistor N21 is turned on. The second reduced voltage RCC2 is ideally the same as the maximum voltage of the inversion signal S1 to insure that transistor P21 is turned off when the inversion signal S1 equal to the reduced voltage VR1. Thus, two transistors TC are preferably used when two transistors TA are used.

When transistor N21 is turned on, the voltage of the first intermediate signal SIM1 on the first intermediate node NIM1 is pulled low which, in turn, turns off transistor MPD. When transistor MPD is turned off, the voltage of the translation signal S2 on node N2 is pulled to one diode drop less than the voltage of the inversion signal S1 on the inversion node N1. Thus, the voltage of the translation signal S2 is equal to VCC−3VTH (VTH1, VTH2, and VTH6). (The voltage of the translation signal S2 (VCC−3VTH) must be greater than the threshold voltage VTH7 of transistor MPD.)

As further shown in FIG. 2, buffer 200 also includes a logic-high translation stage 230 that inverts the inversion signal S2 to output an output signal OUT which has a logic state opposite to that of the inversion signal 52. As described in greater detail below, the output signal OUT has a logic high equal to the power supply voltage VCC, and a logic low equal to ground. Thus, stage 230 outputs the output signal OUT with a logic high that is equal to a CMOS logic high, and a logic low that is equal to a CMOS logic low.

Stage 230 includes a voltage drop 231 that has a number of transistors TE that are connected between the power supply node PSN and a third reduced power supply node RCC3. Each of the transistors TE has an associated voltage drop which, in combination, define a third reduced voltage VR3 on the third reduced power supply node RCC3.

For example, FIG. 2 shows three n-channel transistors TE1, TE2, and TC3 connected between the power supply node PSN and the third reduced power supply node RCC3. Transistor TE1 has a drain and a gate connected to the power supply node PSN, a source, and an eighth threshold voltage drop VTH8. Transistor TE2 has a drain and a gate connected to the source of transistor TE1, a source, and a ninth threshold voltage drop VTH9.

Transistor TE3 has a drain and a gate connected to the source of transistor TE2, a source connected to the third reduced power supply node RCC3, and a tenth threshold voltage drop VTH10. The combined threshold voltage drops VTH8, VTH9, and VTH10 define the third reduced voltage VR3. (VCC−VTH8−VTH9−VTH10=VR3.) Other circuit elements that provide a voltage drop may alternately be used in place of, or in combination with, the diode-connected transistors of circuit 231.

Stage 230 also includes an inverter that is connected to receive the translation signal S2, and to output a second intermediate signal SIM2 which has a logic state that is opposite to signal S2. The inverter includes a p-channel transistor P31 and an n-channel transistor N31. P-channel transistor P31 has a source connected to the reduced power supply node RCC3, and a drain connected to a second intermediate node NIM2 to output the second intermediate signal SIM2. In addition, transistor P31 also has a gate connected to the translation node N2 to receive the translation signal S2, and a third p-channel threshold voltage VTP3.

N-channel transistor N31 has a drain connected to the second intermediate node NIM2 to output the second intermediate signal SIM2, and a source connected to ground. In addition, transistor N31 has a gate connected to the translation node N2 to receive the translation signal S2, and a third n-channel threshold voltage VTN3.

Stage 230 further includes an output circuit 232 that receives the translation signal S2 and the second intermediate signal SIM2. Circuit 232 outputs the output signal OUT with a logic high equal to the power supply voltage VCC when the voltage of the translation signal S2 is low, and a logic low equal to ground when the voltage of the translation signal S2 is high.

Output circuit 232 includes a pair of p-channel transistors P41 and P42 which each have a source connected to the power supply node PSN. Transistor P41 has a gate connected to an output node NOUT, and a drain connected to a third intermediate node NIM3. Transistor P42 has a gate connected to the third intermediate node NIM3, and a drain connected to the output node NOUT.

Output circuit 232 also includes a pair of n-channel transistors N41 and N42 which each have a source connected to ground. Transistor N41 has a gate connected to the second intermediate node NIM2, and a drain connected to the third intermediate node NIM3. Transistor N42 has a gate connected to the translation node N2, and a drain connected to the output node NOUT.

In operation, when the voltage of the translation signal S2 has been pulled to one diode drop less than the voltage of the inversion signal S1, transistor P31 is turned off and transistor N31 is turned on. When transistor N31 is turned on, the voltage of the second intermediate signal SIM2 is pulled low which turns off transistor N41.

The third reduced voltage RCC3 is ideally the same as the maximum voltage of the translation signal S2 to insure that transistor P31 is turned off when the translation signal S2 is equal to the VCC−3VTH. Thus, three transistors TE are preferably used when three transistors (2−TA and 1−TD) are previously used.

In addition, transistor N42 is also turned on which, in turn, pulls the voltage of the output signal OUT on the output node NOUT to ground. Further, the low on the output node NOUT turns on transistor P41 which, since transistor N41 is off, charges up the third intermediate node NIM3. The increased voltage on the third intermediate node N3 turns off transistor P42.

On the other hand, when the voltage of the translation signal S2 has been pulled to ground, transistor P31 turns on and transistor N31 turns off. When transistor P31 turns on, the voltage of the second intermediate signal SIM2 is pulled high which, in turn, turns on transistor N41.

When transistor N41 turns on, the voltage on the third intermediate node NIM3 is pulled low which, in turn, turns on transistor P42. When transistor P42 turns on, the voltage of the output signal OUT is pulled up to the power supply voltage VCC. The logic high of the output signal OUT turns off transistor P41. In addition, the translation signal S2 turns off transistor N42.

One of the advantages of stages 220 and 230 is that the power dissipation is only dynamic. As a result, once the translation and output signals S2 and OUT are latched, there is no current dissipation. Another advantage is that stages 220 and 230 incorporate hysterisis (the logic level of the output signal OUT changes states at different points on the rising and falling edges of the input signal IN). Thus, a TTL-to-CMOS buffer has been described that significantly reduces the current dissipated by the buffer over the entire range of operation.

The present invention is particularly suitable for low power applications where power consumption is more important than speed (buffer 200 is slower than conventional TTL-to-CMOS buffers). In addition, testing results have shown that buffer 200 operates reliably beyond the typical VCC range of 4.4 to 5.5V (buffer 200 should be simulated over the entire range of expected VCC operation to insure operation).

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A translator circuit comprising:
    an inversion stage that outputs an inversion signal in response to an input signal, the inversion signal having a logic high equal to a first voltage which is less than an upper supply voltage, and a logic low equal to a second voltage which is greater than a lower supply voltage;
    a logic-low translation stage that outputs a translation signal in response to the inversion signal, the translation signal having a logic high equal to a second voltage which is less than the first voltage, and a logic low equal to the lower supply voltage; and
    a logic-high translation stage that outputs an output signal in response to the translation signal, the output signal having a logic high equal to the upper supply voltage, and a logic low equal to the lower supply voltage.

2. The circuit of claim 1 wherein the inversion stage includes:
    a first voltage drop circuit connected to an upper supply node and a first reduced power supply node, the upper supply node having the upper supply voltage;
    a first inverter connected to receive the input signal, and to output the inversion signal, the first inverter having:
        a first p-channel transistor having a source connected to the first reduced power supply node, a drain connected to an inversion node to output the inversion signal, a gate connected to an input node to receive the input signal, and a first p-channel threshold voltage; and
        a first n-channel transistor having a drain connected to the inversion node to output the inversion signal, a source connected to an increased ground node, a gate connected to the input node to receive the input signal, and a first n-channel threshold voltage; and a second voltage drop circuit connected to the increased ground node and a lower supply node, the lower supply node having the lower supply voltage.

3. The circuit of claim 2 wherein a first reduced voltage on the first reduced power supply node is set such that when the input voltage on the input node is at a minimum logic high voltage, the gate-to-source voltage of the p-channel transistor is greater than the first p-channel threshold voltage.

4. The circuit of claim 3 wherein an increased voltage on the increased ground node is set such that when the input voltage on the input node is at a maximum logic high voltage, the gate-to-source voltage of the n-channel transistor is less than the first n-channel threshold voltage.

5. The circuit of claim 2 wherein the first voltage drop circuit includes a number of first transistors that are connected between the upper supply node and the first reduced power supply node, each of the first transistors having an associated voltage drop which, in combination, define a first reduced voltage on the first reduced power supply node.

6. The circuit of claim 5 wherein the second voltage drop circuit includes a number of second transistors that are connected between the increased ground node and the lower supply node.

7. The circuit of claim 1 wherein the inversion stage inverts the input signal to output the inversion signal with a logic state opposite to that of the input signal, and wherein the logic-high translation stage inverts the translation signal to output the output signal with a logic state opposite to that of the translation signal.

8. The circuit of claim 2 wherein the logic-low translation stage includes:
a third voltage drop circuit connected to the upper supply node and a second reduced power supply node;
a second inverter connected to receive the inversion signal, and to output a first intermediate signal, the second inverter having:
a second p-channel transistor having a source connected to the second reduced power supply node, a drain connected to a first intermediate node to output the first intermediate signal, a gate connected to the inversion node to receive the inversion signal, and a second p-channel threshold voltage; and
a second n-channel transistor having a drain connected to the first intermediate node to output the first intermediate signal, a source connected to the lower supply node, a gate connected to the inversion node to receive the inversion signal, and a second n-channel threshold voltage; and
a fourth voltage drop circuit connected to the inversion node and a translation node; and
a control transistor having a drain connected to the translation node, a gate connected to the first intermediate node, and a source connected to the lower supply node, the translation signal appearing on the translation node.

9. The circuit of claim 8 wherein the third voltage drop circuit includes a number of third transistors that are connected between the upper supply node and the second reduced power supply node, each of the third transistors having an associated voltage drop which, in combination, define a second reduced voltage on the second reduced power supply node.

10. The circuit of claim 9 wherein the fourth voltage drop circuit includes a number of fourth transistors that are connected between the inversion node and the translation node.

11. The circuit of claim 8 wherein the logic-high translation stage includes:
a fifth voltage drop circuit connected to the upper supply node and a third reduced power supply node;
a third inverter connected to receive the translation signal, and to output a second intermediate signal, the third inverter having:
a third p-channel transistor having a source connected to the third reduced power supply node, a drain connected to a second intermediate node to output the second intermediate signal, a gate connected to the translation node to receive the translation signal, and a third p-channel threshold voltage; and
a third n-channel transistor having a drain connected to the second intermediate node to output the second intermediate signal, a source connected to the lower supply node, a gate connected to the translation node to receive the translation signal, and a third n-channel threshold voltage; and
an output circuit connected to the translation node, the second intermediate node, and the output node.

12. The circuit of claim 11 wherein the fifth voltage drop circuit includes a number of fifth transistors that are connected between the upper supply node and the third reduced power supply node, each of the fifth transistors having an associated voltage drop which, in combination, define a third reduced voltage on the third reduced power supply node.

13. The circuit of claim 12 wherein the output circuit includes:
a first output p-channel transistor having a source connected to the upper supply node, a gate connected to the output node, and a drain connected to a third intermediate node;
a second output p-channel transistor having a source connected to the upper supply node, a gate connected to the third intermediate node, and a drain connected to the output node;
a first output n-channel transistor having a source connected to the lower supply node, a gate connected to the second intermediate node, and a drain connected to the third intermediate node; and
a second output n-channel transistor having a source connected to the lower supply node, a gate connected to the inversion node, and a drain connected to the output node.

14. A method for operating a translator circuit, the method comprising the steps of:
outputting an inversion signal from an inversion stage in response to an input signal, the inversion signal having a logic high equal to a first voltage which is less than an upper supply voltage, and a logic low equal to a second voltage which is greater than a lower supply voltage;
outputting a translation signal from a logic-low translation stage in response to the inversion signal, the translation signal having a logic high equal to a second voltage which is less than the first voltage, and a logic low equal to the lower supply voltage; and
outputting an output signal from a logic-high translation stage in response to the translation signal, the output signal having a logic high equal to the upper supply voltage, and a logic low equal to the lower supply voltage.

15. The method of claim 14 wherein the inversion stage includes:

a first voltage drop circuit connected to an upper supply node and a first reduced power supply node;

a first inverter connected to receive the input signal, and to output the inversion signal, the first inverter having:

a first p-channel transistor having a source connected to the first reduced power supply node, a drain connected to an inversion node to output the inversion signal, a gate connected to an input node to receive the input signal, and a first p-channel threshold voltage; and a first n-channel transistor having a drain connected to the inversion node to output the inversion signal, a source connected to an increased ground node, a gate connected to the input node to receive the input signal, and a first n-channel threshold voltage; and a second voltage drop circuit connected to the increased ground node and the lower supply node.

16. The method of claim 15 wherein the logic-low translation stage includes:

a third voltage drop circuit connected to the upper supply node and a second reduced power supply node;

a second inverter connected to receive the inversion signal, and to output a first intermediate signal, the second inverter having:

a second p-channel transistor having a source connected to the second reduced power supply node, a drain connected to a first intermediate node to output the first intermediate signal, a gate connected to the inversion node to receive the inversion signal, and a second p-channel threshold voltage; and a second n-channel transistor having a drain connected to the first intermediate node to output the first intermediate signal, a source connected to the lower supply node, a gate connected to the inversion node to receive the inversion signal, and a second n-channel threshold voltage; and a fourth voltage drop circuit connected to the inversion node and a translation node; and a control transistor having a drain connected to the translation node, a gate connected to the first intermediate node, and a source connected to the lower supply node, the translation signal appearing on the translation node.

17. The method of claim 16 wherein the logic-high translation stage includes:

a fifth voltage drop circuit connected to the upper supply node and a third reduced power supply node;

a third inverter connected to receive the translation signal, and to output a second intermediate signal, the third inverter having:

a third p-channel transistor having a source connected to the third reduced power supply node, a drain connected to a second intermediate node to output the second intermediate signal, a gate connected to the translation node to receive the translation signal, and a third p-channel threshold voltage; and a third n-channel transistor having a drain connected to the second intermediate node to output the second intermediate signal, a source connected to the lower supply node, a gate connected to the translation node to receive the translation signal, and a third n-channel threshold voltage; and an output circuit connected to the translation node, the second intermediate node, and the output node.

* * * * *